United States Patent
Wen et al.

(10) Patent No.: US 11,973,048 B2
(45) Date of Patent: Apr. 30, 2024

(54) SEMICONDUCTOR PACKAGE AND METHOD FOR MANUFACTURING THE SAME

(71) Applicant: Advanced Semiconductor Engineering, Inc., Kaohsiung (TW)

(72) Inventors: An-Nong Wen, Kaohsiung (TW); Ching-Han Huang, Kaohsiung (TW); Ching-Ho Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 53 days.

(21) Appl. No.: 17/521,786

(22) Filed: Nov. 8, 2021

(65) Prior Publication Data

US 2022/0068868 A1 Mar. 3, 2022

Related U.S. Application Data

(63) Continuation of application No. 16/592,683, filed on Oct. 3, 2019, now Pat. No. 11,171,108.

(Continued)

(51) Int. Cl.
*H01L 23/48* (2006.01)
*B81B 7/00* (2006.01)
(Continued)

(52) U.S. Cl.
CPC ............ *H01L 24/17* (2013.01); *B81B 7/007* (2013.01); *B81C 3/001* (2013.01); *H01L 24/11* (2013.01); *H01L 24/16* (2013.01); *B81B 2207/012* (2013.01); *B81B 2207/098* (2013.01); *B81C 2203/035* (2013.01); *B81C 2203/0792* (2013.01); *H01L 2224/11462* (2013.01); *H01L 2224/11825* (2013.01); *H01L 2224/11849* (2013.01); *H01L 2224/16145* (2013.01); *H01L 2224/1703* (2013.01); *H01L 2224/17517* (2013.01); *H01L 2924/1433* (2013.01); *H01L 2924/1461* (2013.01)

(58) Field of Classification Search
CPC ......... H01L 24/17; H01L 24/05; H01L 24/14; B81B 2207/09
See application file for complete search history.

(56) References Cited

U.S. PATENT DOCUMENTS 7,545,031 B2 6/2009 Kwon
9,865,574 B2 * 1/2018 Huang .................. H01L 25/105
(Continued)

OTHER PUBLICATIONS

Non-Final Office Action for U.S. Appl. No. 16/592,683, dated Apr. 1, 2021, 8 pages.
(Continued)

*Primary Examiner* — Hoa B Trinh
(74) *Attorney, Agent, or Firm* — FOLEY & LARDNER LLP

(57) ABSTRACT

A semiconductor package includes a first die having a first surface, a first conductive bump over the first surface and having first height and a first width, a second conductive bump over the first surface and having a second height and a second width. The first width is greater than the second width and the first height is substantially identical to the second height. A method for manufacturing the semiconductor package is also provided.

12 Claims, 18 Drawing Sheets

Related U.S. Application Data

(60) Provisional application No. 62/741,490, filed on Oct. 4, 2018.

(51) Int. Cl.
  *B81C 3/00* (2006.01)
  *H01L 23/00* (2006.01)

(56) References Cited

U.S. PATENT DOCUMENTS

| | | | | |
|---|---|---|---|---|
| 2009/0127703 | A1* | 5/2009 | Lee | H01L 24/05 |
| | | | | 257/737 |
| 2012/0086123 | A1* | 4/2012 | Park | H01L 24/14 |
| | | | | 257/738 |
| 2012/0153462 | A1* | 6/2012 | Wakiyama | H01L 24/83 |
| | | | | 257/737 |
| 2013/0228916 | A1 | 9/2013 | Mawatari | |

OTHER PUBLICATIONS

Notice of Allowance for U.S. Appl. No. 16/592,683, dated Jul. 13, 2021, 9 pages.

\* cited by examiner

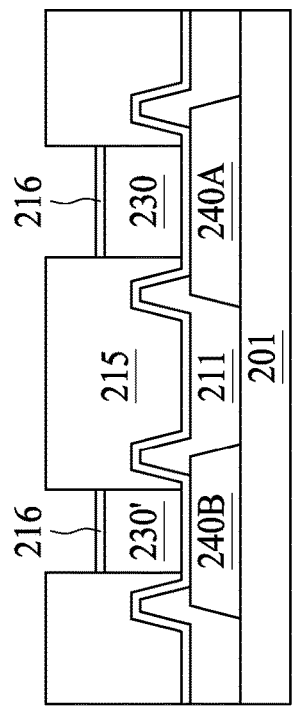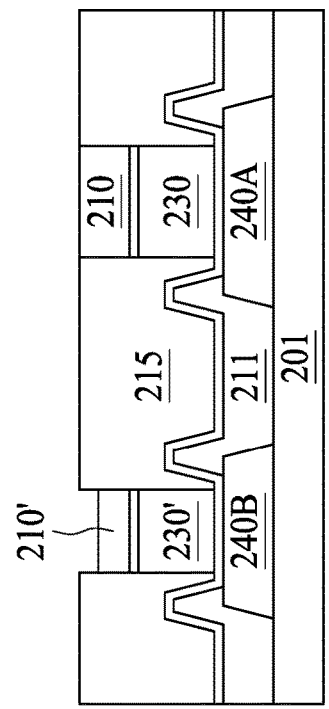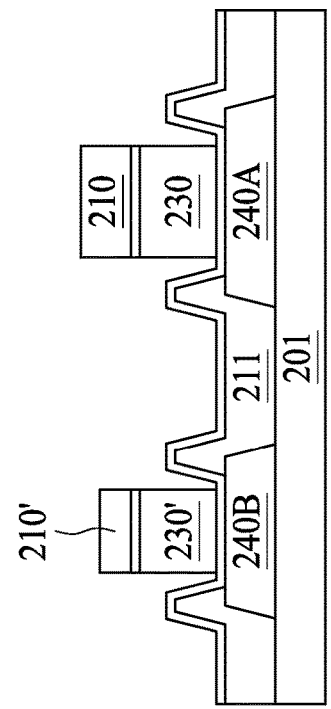

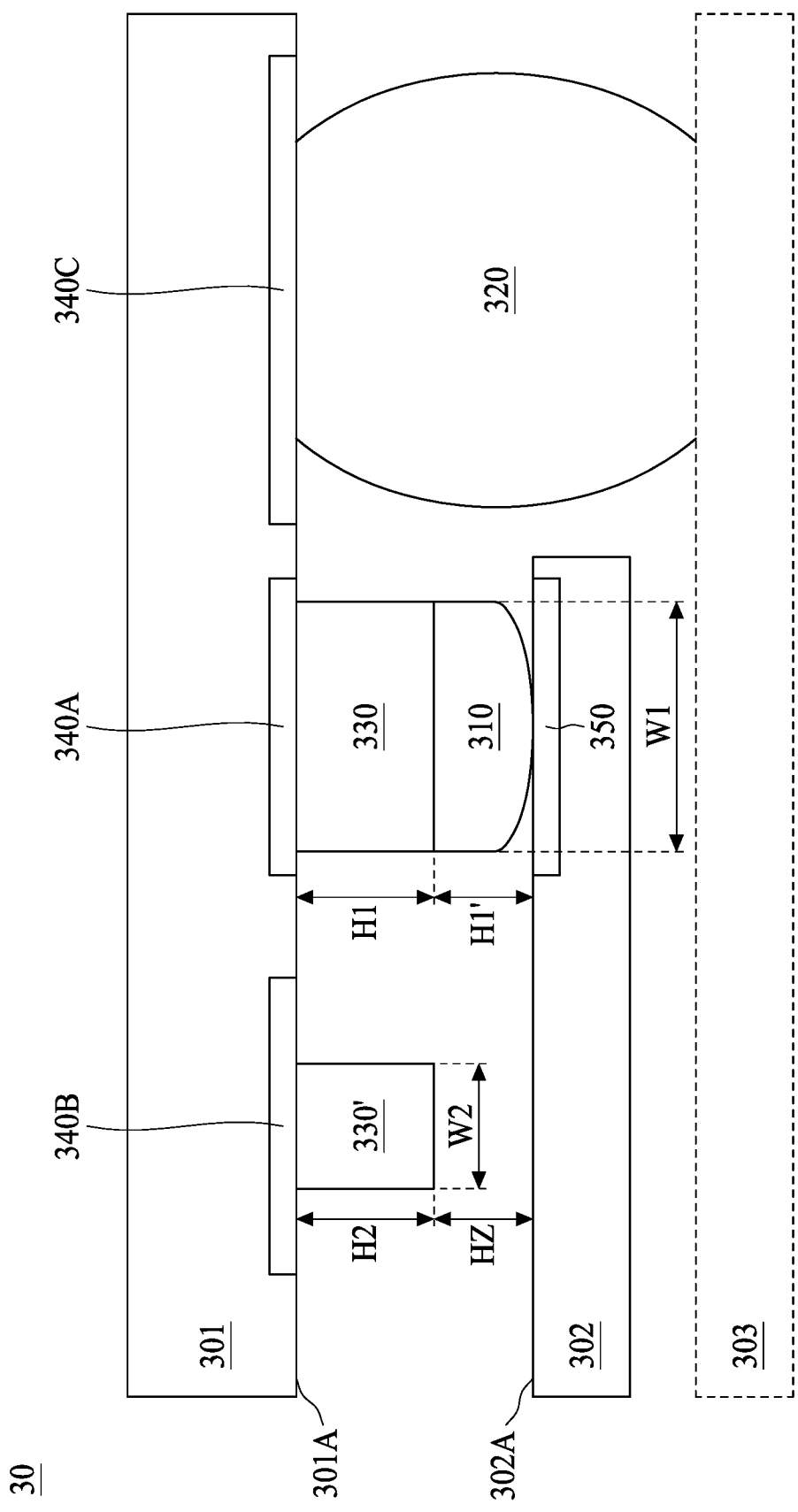

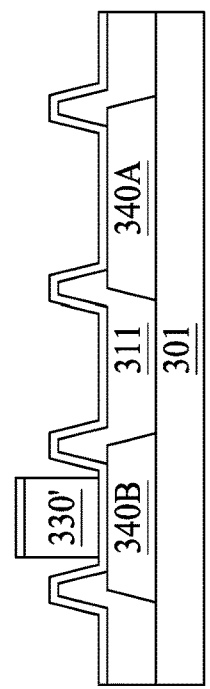
FIG. 3D
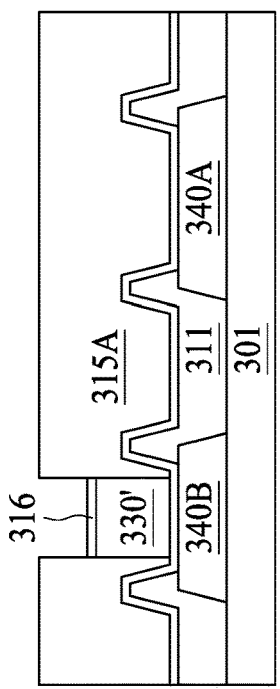
FIG. 3E
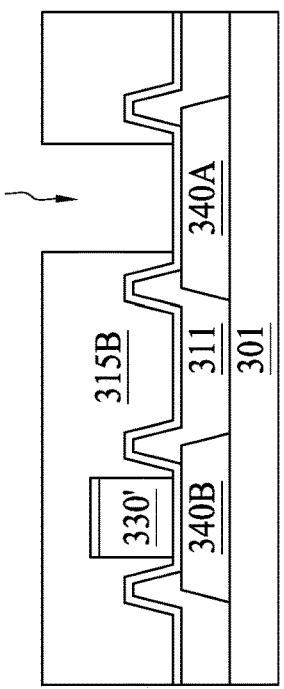
FIG. 3F
FIG. 3A
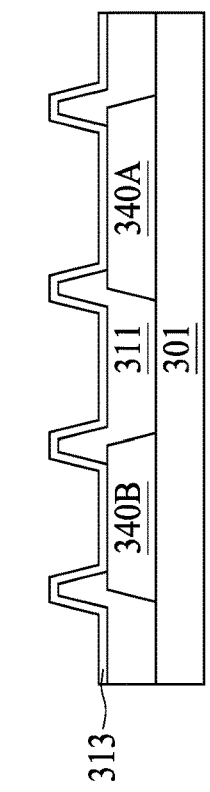
FIG. 3B
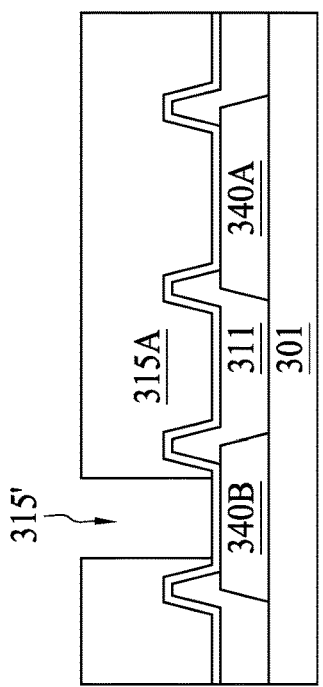
FIG. 3C

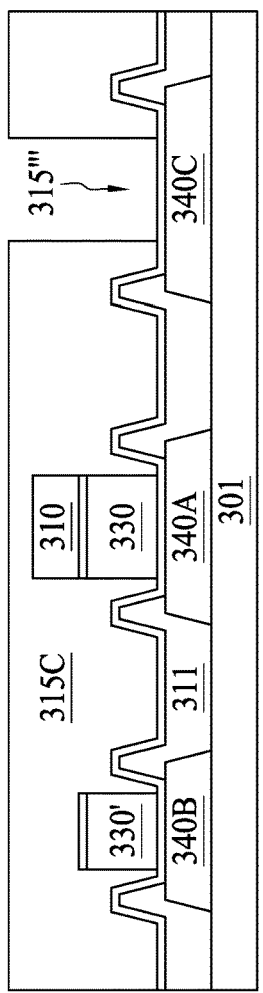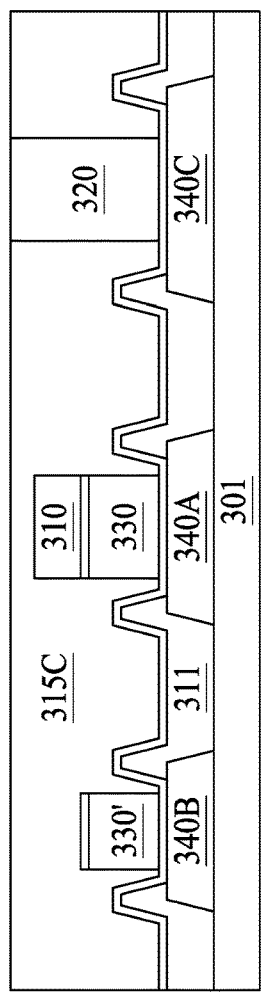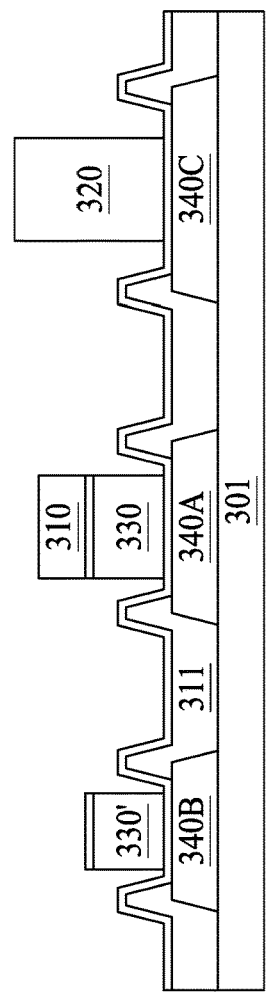

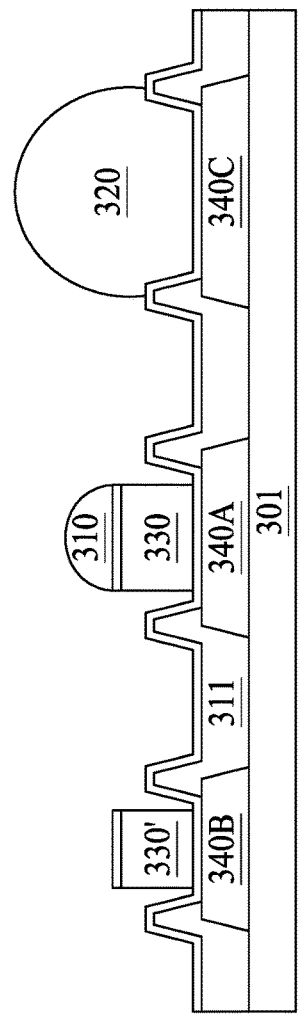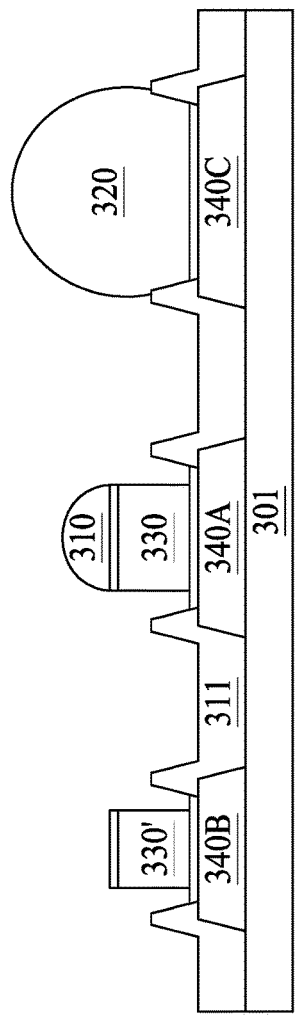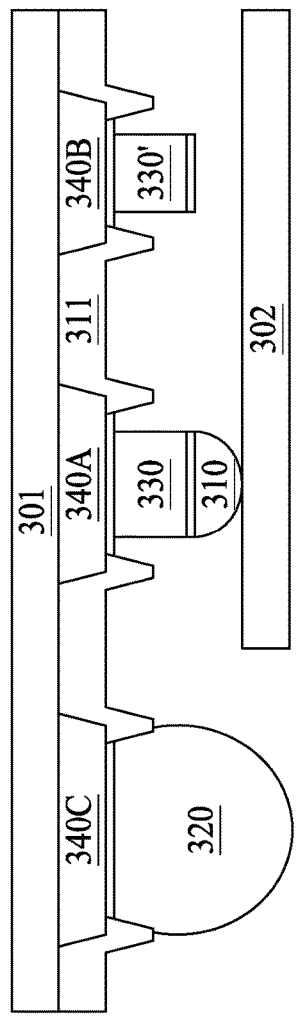

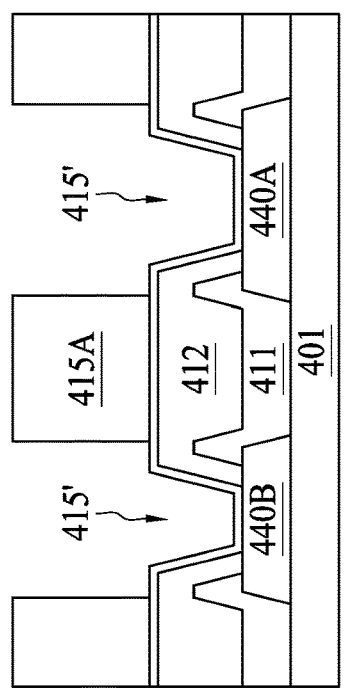
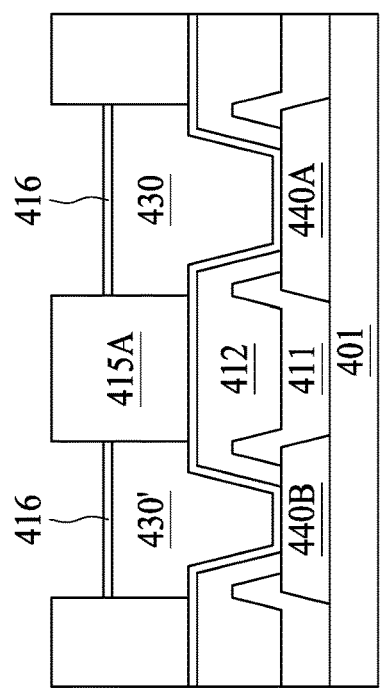
FIG. 4D
FIG. 4E
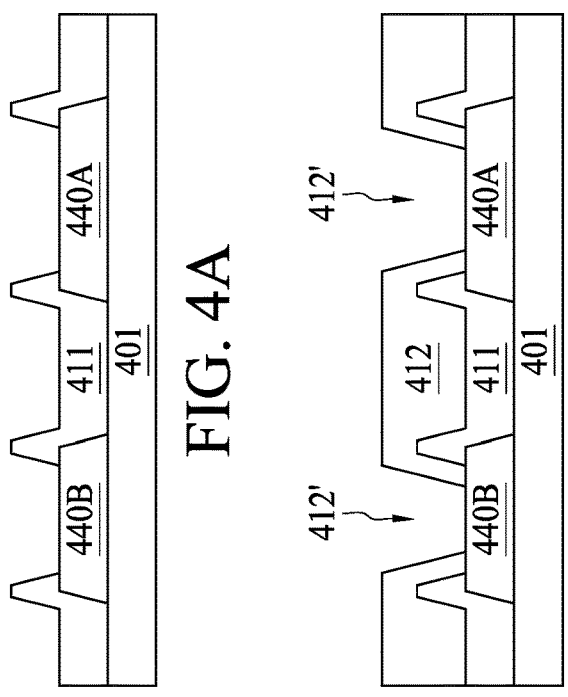
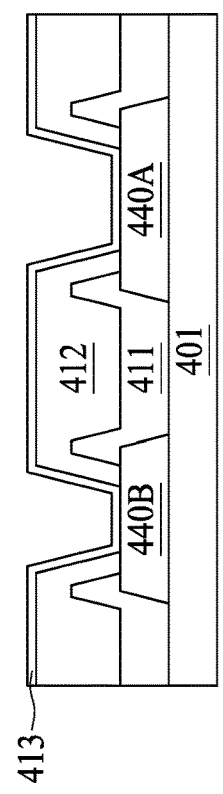
FIG. 4A
FIG. 4B
FIG. 4C

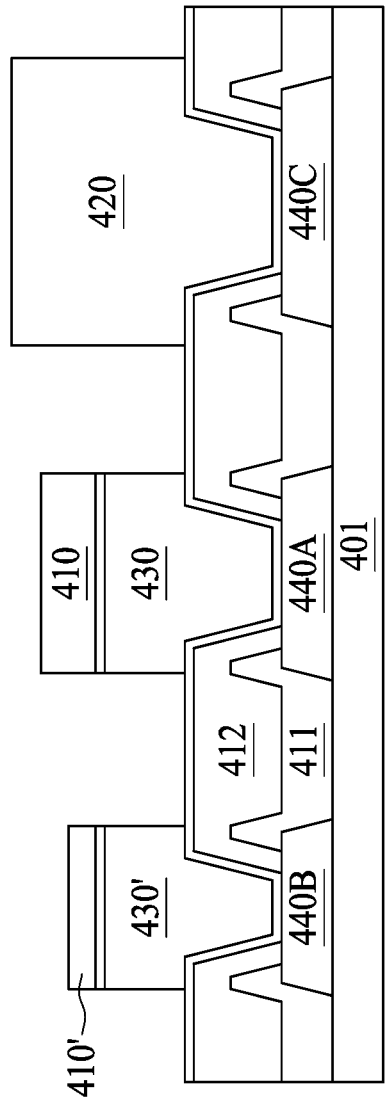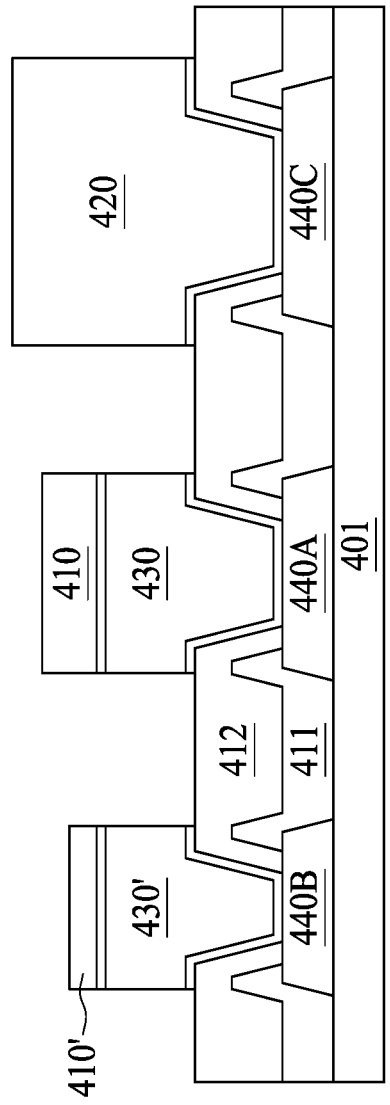
FIG. 4J
FIG. 4K

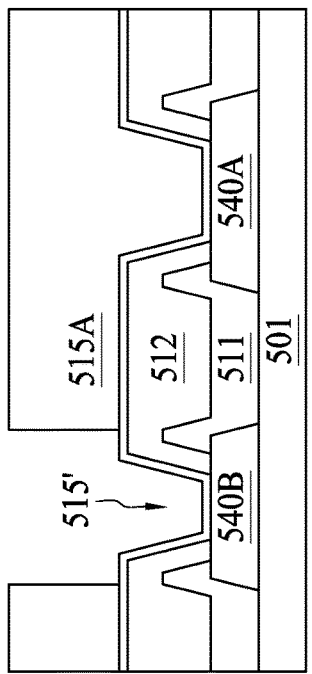
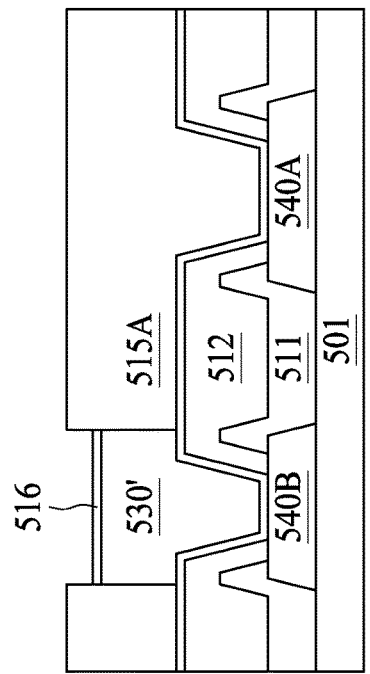
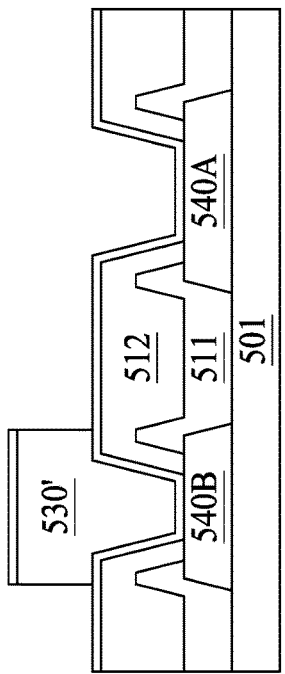
FIG. 5D  FIG. 5E  FIG. 5F
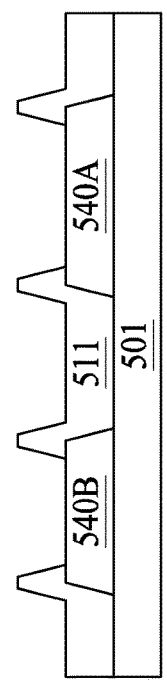
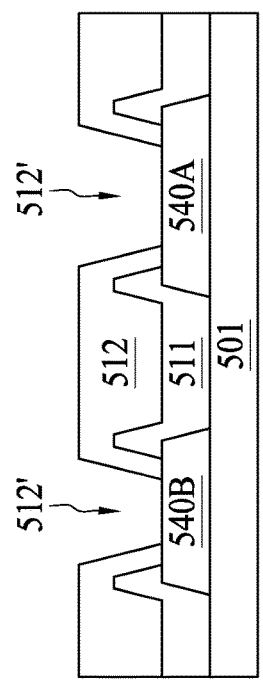
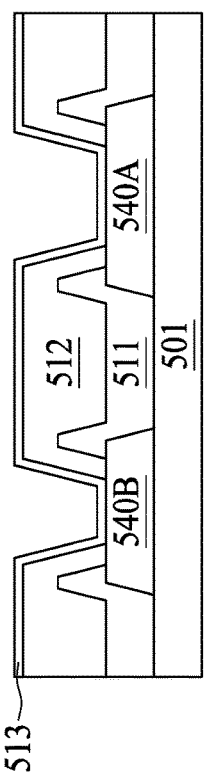
FIG. 5A  FIG. 5B  FIG. 5C

SEMICONDUCTOR PACKAGE AND METHOD FOR MANUFACTURING THE SAME

CROSS-REFERENCE TO RELATED APPLICATIONS

This application is a continuation of U.S. patent application Ser. No. 16/592,683 filed Oct. 3, 2019, which claims the benefit of and priority to U.S. Provisional Application No. 62/741,490, filed Oct. 4, 2018, the contents of which are incorporated herein by reference in their entireties.

BACKGROUND

1. Technical Field

The present disclosure relates to a Microelectromechanical Systems (MEMS) package.

2. Description of the Related Art

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in products such as automobile airbag systems, control applications in automobiles, navigation, display systems, inkjet cartridges, and so forth. Capacitive-sensing MEMS accelerometer designs are highly desirable for operation in high gravity environments and in miniaturized devices due to their relatively low cost.

For example, a MEMS device may include a movable part that is moved toward a stationary electrical contact on a device substrate by the influence of motion, pressure, electrical stimuli, or the like. The movable part may be a flexible member that bends under applied forces such as electrostatic attraction, magnetic attraction and repulsion, or thermally induced differential expansion, that reduces a gap between the movable part and the stationary contact. To prevent the movable part from making direct contact with the stationary electrical contact on the device substrate, one or more mechanical stopper are normally formed on one of the surfaces to control the gap, or Z height between the MEMS device and the device substrate.

SUMMARY

In some embodiments, the present disclosure provides a semiconductor package structure, including a first die having a first surface, a first conductive bump over the first surface and having first height and a first width, a second conductive bump over the first surface and having a second height and a second width. The first width is greater than the second width and the first height is substantially identical to the second height.

In some embodiments, the present disclosure provides a method for manufacturing a semiconductor package. The method includes receiving a first wafer having a first conductive pad and a second conductive pad, forming a first conductive bump on the first conductive pad and a second conductive bump on the second conductive pad, wherein a width of the first conductive bump is greater than a width of the second conductive bump, and a height of the first conductive bump is substantially identical to the second conductive bump, and bonding the first conductive bump to a second die.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 2A, FIG. 2B, FIG. 2C, FIG. 2D, FIG. 2E, FIG. 2F, FIG. 2G, FIG. 2H, FIG. 2I, and FIG. 2J illustrate cross sectional views of the semiconductor package during various manufacturing stages, according to some embodiments of the present disclosure.

FIG. 3 illustrates a cross sectional view of a semiconductor package, according to some embodiments of the present disclosure.

FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L, FIG. 3M, FIG. 3N, and FIG. 3O illustrate cross sectional views of the semiconductor package during various manufacturing stages, according to some embodiments of the present disclosure.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, and FIG. 4M illustrate cross sectional views of the semiconductor package during various manufacturing stages, according to some embodiments of the present disclosure.

FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, and FIG. 5N illustrate cross sectional views of the semiconductor package during various manufacturing stages, according to some embodiments of the present disclosure.

DETAILED DESCRIPTION

Figure 1A:
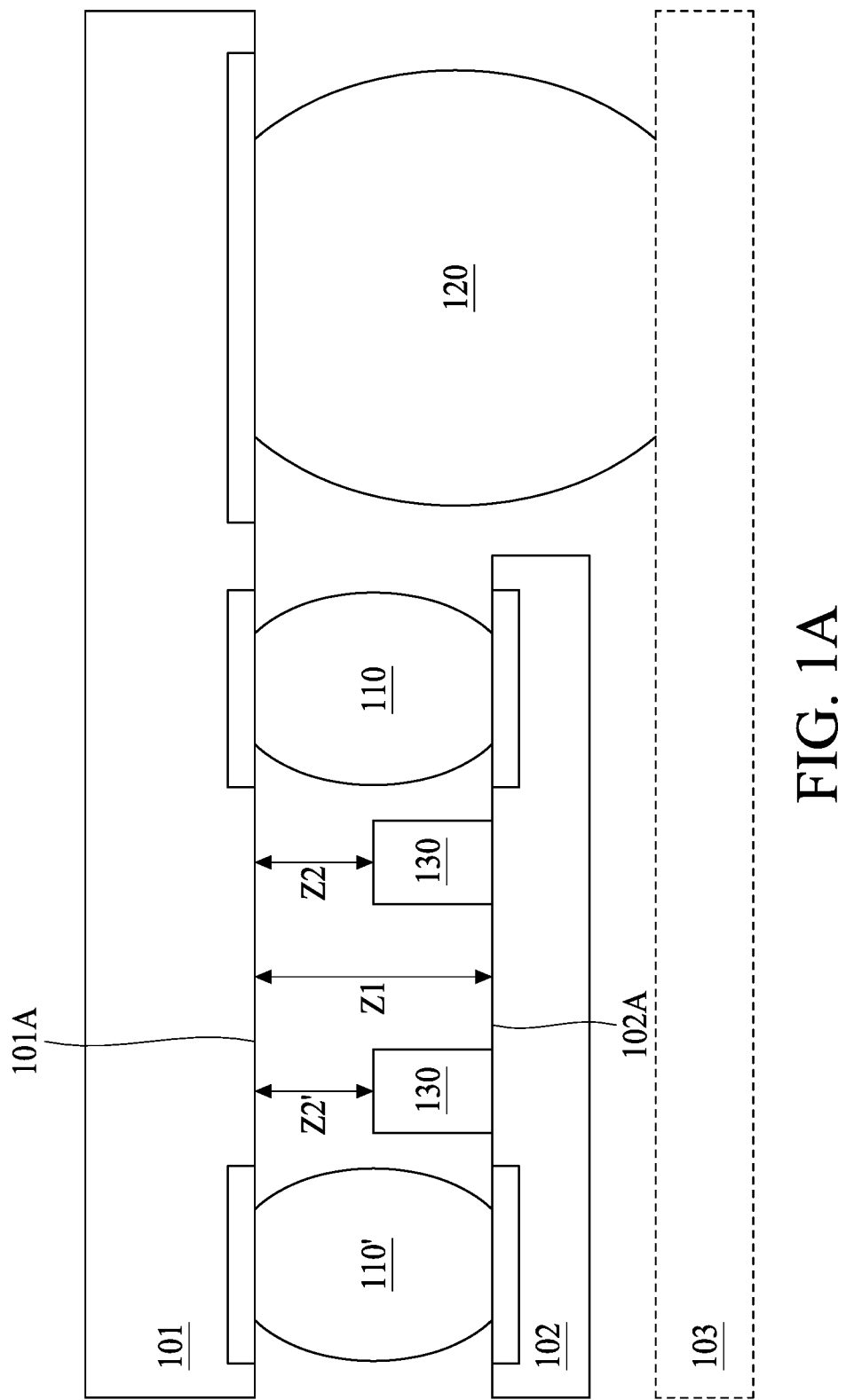
FIG. 1A illustrates a cross sectional view of a semiconductor package bonding a semiconductor die with a semiconductor die through a conductive terminal, according to some comparative embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A illustrates a cross sectional view of a semiconductor package bonding a semiconductor die 101 with a semiconductor die 102 through a first conductive terminal 110, for example, a solder bump, according to some comparative embodiments of the present disclosure. A first surface 101A of the semiconductor die 101 is facing a second surface 102A of the semiconductor die 102. Optionally, the semiconductor die 101 and the semiconductor die 102 are further bonded to a substrate 103 (shown in dotted lines) through a conductive terminal 120 on the semiconductor die 101. In some embodiments, the semiconductor die 101 is an Application-Specific Integrated Circuit (ASIC) die. In some embodiments, the semiconductor die 102 is a Microelectromechanical system (MEMS) die.

Microelectromechanical system (MEMS) is a microelectromechanical device fabricated in a microminiaturized package structure, and the fabricating technique thereof is quite similar to the technique of fabricating integrated circuits (ICs). However, interactions, for example, about mechanics, optics, or magnetic force between the MEMS device and surrounding environment are more than that of the comparative IC. The MEMS die may include micro-sized electromechanical components (for example, switches, mirrors, capacitors, accelerometers, sensors, capacitive sensors, or actuators etc.), and the MEMS die may be integrated with the IC in a manner of single block, thereby greatly modifying insertion loss or electrical isolation effect of the overall solid-state device. However, in the macroscopic world of the entire package structure, the MEMS die is extremely weak and may be impacted by slight static electricity or surface tension at any moment to cause failure.

Mechanical stopper 130, disposed on the second surface 102A of a MEMS die, serves the purpose of controlling a spacing Z1 between the first surface 101A and the second surface 102A. Moreover, a spacing Z2 between the first surface 101A and the mechanical stopper 130 can be controlled by alternating a height of the mechanical stopper 130. In a MEMS pressure sensor for example, not only the spacing Z1 but also the spacing Z2 are important to the sensitivity of the MEMS pressure sensor since a predetermined channel dimension for fluid circulation should be met.

Figure 1B:
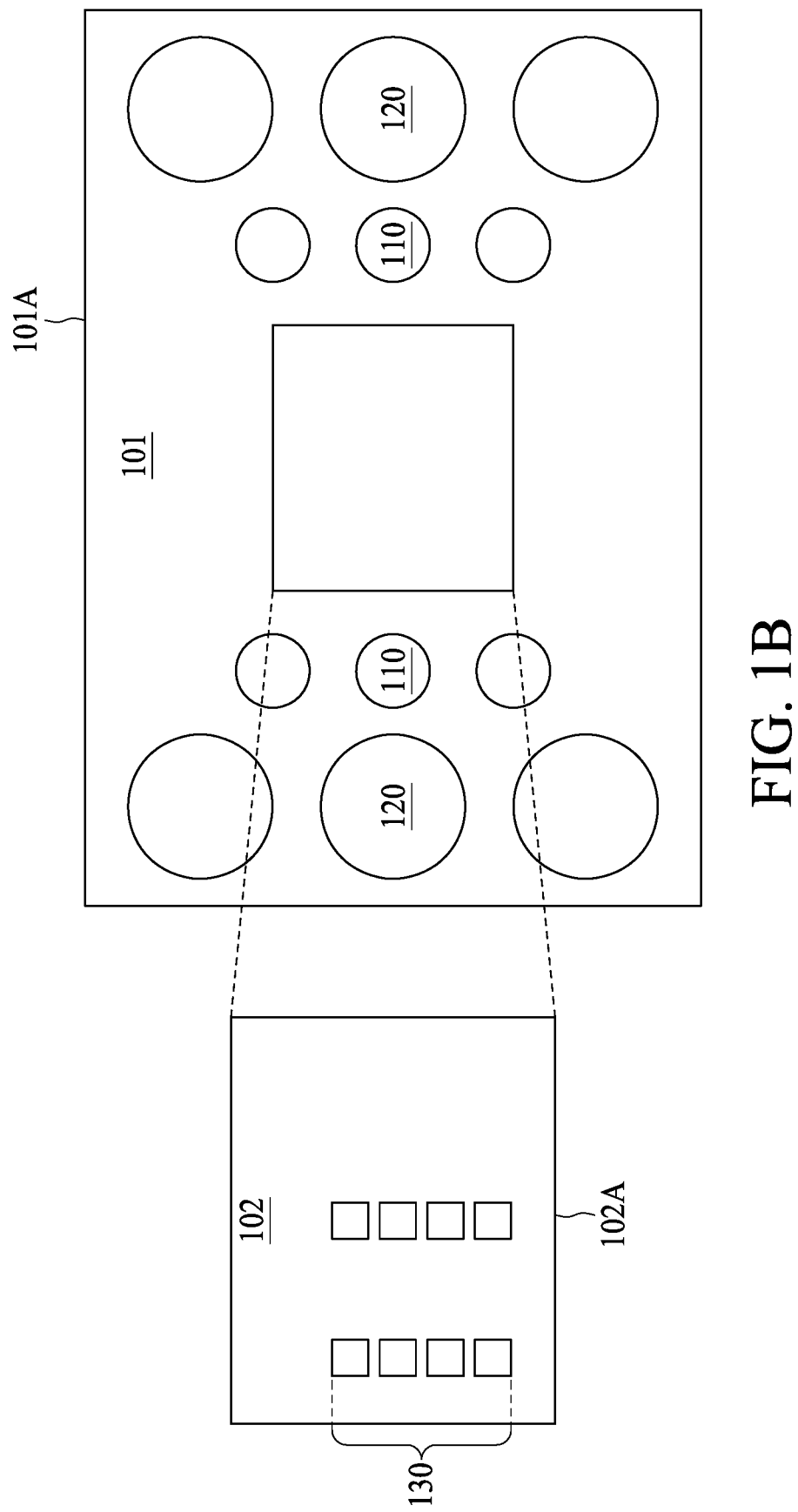
FIG. 1B illustrates a top view of the semiconductor package of FIG. 1A, according to some comparative embodiments of the present disclosure.

FIG. 1B illustrates a top view of the semiconductor package of FIG. 1A, according to some comparative embodiments of the present disclosure. The semiconductor die 102 is enlarged to show an array of mechanical stoppers 130 on a second surface 102A of the MEMS die. As shown in FIG. 1B, the semiconductor die 102 is bonded to a region of the semiconductor die 101 through an array of conductive terminals 110, with the second surface 102A facing the first surface 101A. An array of conductive terminals 120 are also positioned on the first surface 101A of the semiconductor die 101, for subsequent integration of the semiconductor package to a substrate.

However, when the conductive terminal 110 bonding the semiconductor die 101 and the semiconductor die 102 is a solder bump, the spacing Z1 and spacing Z2 cannot be well controlled because the reflow operation of the solder bump cannot be controlled under sufficient uniformity. For example, solder bumps of the same dimensions can end up with different Z-heights after undergoing the same reflow operations. In this connection, the spacing Z1 and spacing Z2 can vary from package to package after the reflow. Furthermore, within the same package, due to various reflow conditions on the conductive terminals 110 and 110', a Z-height of the conductive terminal 110' may be different from a Z-height of the conductive terminal 110, rendering different spacing Z2 and spacing Z2', and thus causing semiconductor die 102 tilting problem. In addition, when conductive terminals 110 and 110' are formed by solder bumps (including solder ball or solder paste), soldering flux applied during the reflow and bonding operation can easily contaminate an active region of the MEMS die, for example, a thin film region surrounded by the mechanical stopper 130.

Given the above problems, a bonding structure between semiconductor die 101 and semiconductor die 102, especially an ASIC die and a MEMS die, which provides better Z-height uniformity within wafer and within package, better controllable Z-height, and free of flux contamination to any active regions of the semiconductor dies 101 or 102, is of production interest.

Figure 2:
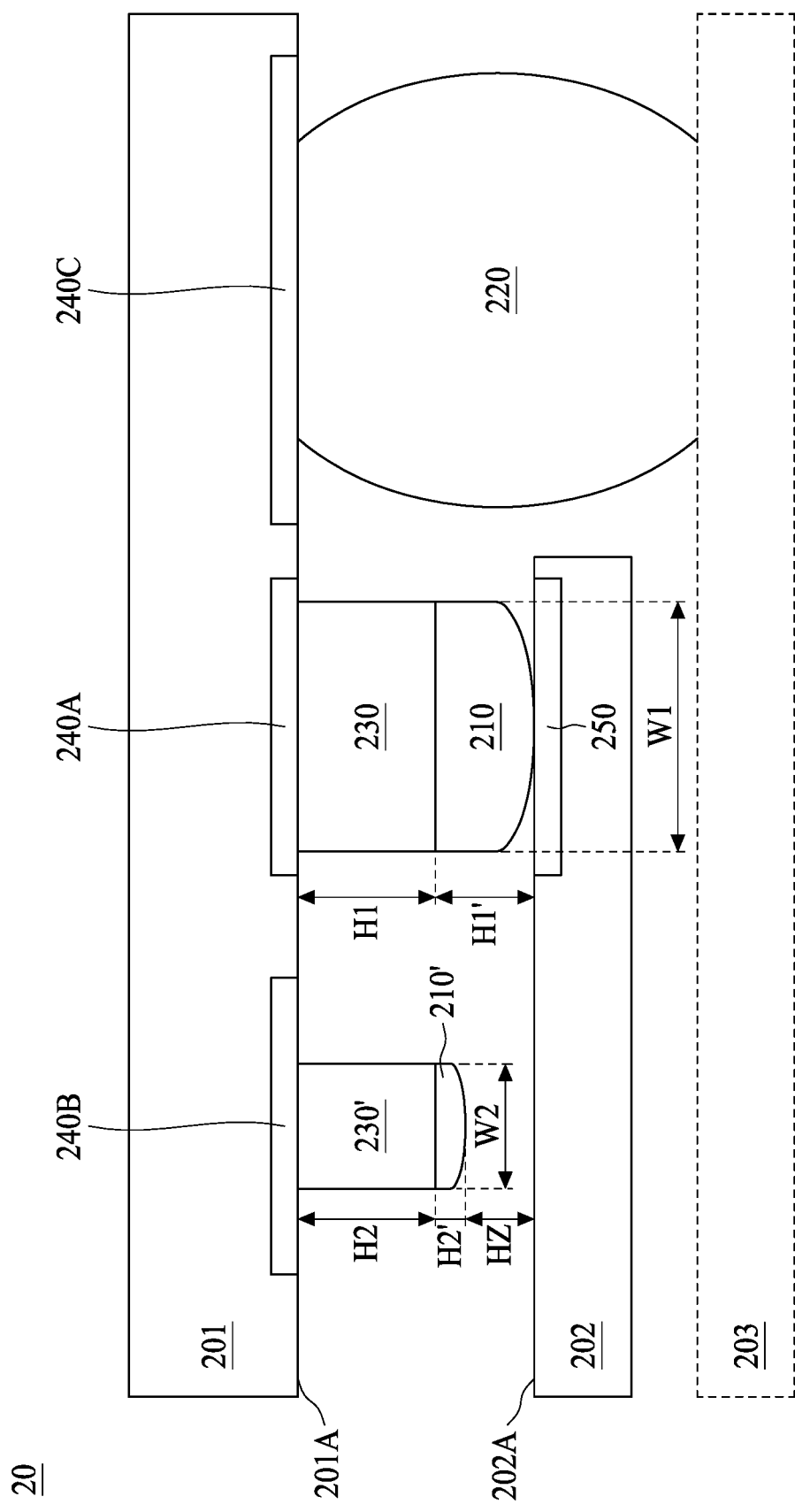
FIG. 2 illustrates a cross sectional view of a semiconductor package, according to some embodiments of the present disclosure.

Referring to FIG. 2, FIG. 2 illustrates a cross sectional view of a semiconductor package 20, in accordance with some embodiments of present disclosure. The semiconductor package 20 includes a first die 201 bonded to a second die 202 through a first conductive bump 230. Specifically, the first conductive bump 230 is landed on a first conductive pad 240A of the first die 201. The first conductive pad 240A has a width greater than a width W1 of the first conductive bump 230. As previously discussed, the first die 201 can be an ASIC die, and the second die 202 can be a MEMS die. The first conductive bump 230 is joined to a conductive pad 250 of the second die 202 by a first solder bump 210. In some embodiments, a connection between the first die 201 and the second die 202 through the first conductive bump 230 and the first solder bump 210 rendering the first conductive bump 230 an active bump since the electronic signal from the second die 202 can be transmitted to the first die 201 through such connection and vice versa.

The semiconductor package 20 further includes a second conductive bump 230' landed on a second conductive pad 240B of the first die 201. The second conductive pad 240B has a width greater than a width W2 of the second conductive bump 230'. Although having a solder bump 210' at one end of the second conductive bump 230', the second conductive bump 230' is free from joining to any conductive pad of the second die 202. Alternatively stated, the spacing HZ between the solder bump 210' and the second die 202 in a vertical direction is controlled so that the solder bump 210' does not touch the second die 202. In some embodiments, free of connection from the first die 201 to the second die 202 through the second conductive bump 230' rendering the second conductive bump 230' a dummy bump since no electronic signal from the second die 202 can be transmitted to the first die 201 through such connection and vice versa. In some embodiments, the second conductive bump 230' on the first surface 201A of the first die 201 serves as a mechanical stopper in the semiconductor package 20 when the second die 202 is a MEMS die, for example, a MEMS die integrated with pressure sensors.

Although the first conductive pad 240A and the second conductive pad 240B may have a substantially same width, the width W1 of the first conductive bump 230 is greater than the width W2 of the second conductive bump 230'. In some embodiments, the width W1 is less than about 2 times of the width W2. In some embodiments, the width W1 is about 1.3 to 1.5 times of the width W2. When the first conductive bump 230 and the second conductive bump 230' are formed under a same lithography operation, a height H1 of the first conductive bump 230 is substantially the same as a height H2 of the second conductive bump 230', as illustrated in FIG. 2. However, when two lithography operations are performed to form the first conductive bump 230 and the second conductive bump 230', the second conductive bump 230' may or may not have a same height as the first conductive bump 230.

A solder bump height H1' of the first solder bump 210 is substantially greater than a solder bump height H2' of the second solder bump 210', regardless of using one lithography operation or more than one lithography operations to perform the solder printing operation.

A third conductive pad 240C on the first die 201 is connected to a conductive terminal 220, which in some embodiments can be a solder ball or printed solder paste. The conductive terminal 220 is configured to bond the first die 201 together with the second die 202 to a substrate 203. With the above description, the conductive terminal 220 may have a height greater than a summation of the heights H1, H1', and a thickness of the second die 202.

Referring to FIG. 2A to FIG. 2J, FIG. 2A to FIG. 2J illustrate cross sectional views of the semiconductor package during various manufacturing stages, in accordance with some embodiments of present disclosure. In FIG. 2A, a processed semiconductor wafer is received for subsequent packaging operations. The processed semiconductor wafer includes a plurality of die areas 201, each die area includes at least a first conductive pad 240A and a second conductive pad 240B. A polymeric layer 211, for example, polybenzoxazole (PBO) is formed on a surface of the die area 201 and covering an edge of the first and second conductive pads 240A, 240B. In FIG. 2B, an under bump metallization (UBM) 213 is conformably sputtered cover the first and second conductive pads 240A, 240B, and the polymeric layer 211. In FIG. 2C, a masking layer 215, for example, a photoresist layer, is spun on and patterned over the semiconductor wafer, exposing a portion of the first and second conductive pads 240A, 240B through openings 215'. Note a width of the opening 215' patterned at the current operation determines a width of the first conductive bump 230 and a width the second conductive bump 230' formed in the subsequent operations. When the first conductive pad 240A and the second conductive pad 240B are having a same width, the opening 215' over the first conductive pad 240A can be wider than the opening 215' over the second conductive pad 240B by patterning design. When the first conductive pad 240A is wider than the second conductive pad 240B, the opening 215' over the first conductive pad 240A can be wider than the opening 215' over the second conductive pad 240B by simply scaling from the widths of underlying conductive pads 240A, 240B.

In FIG. 2D, a metal plating operation is performed to form the first conductive bump 230 and the second conductive bump 230' in the openings 215'. In some embodiments, the metal plating includes a copper electroplating operation. Under one electroplating operations, the first conductive bump 230' and the second conductive bump 230' possess a same height. Optionally, a nickel (Ni) layer 216 is formed over the top of the first and second conductive bumps 230, 230'. In FIG. 2E, a solder plating operation is conducted to form solder bumps 210, 210' over the first and second conductive bumps 230, 230', respectively. Note the solder bump 210' over the second conductive bump 230' is thinner than the solder bump 210 over the first conductive bump 230 since the thickness of solder plating depends on the underlying conductive area. The greater the area the thicker the solder bump would form. Based on this electroplating feature, a narrower conductive bump 230' can have a thinner solder bump 210', while a wider conductive bump 230 can have a thicker solder bump 210.

Figure 2G:
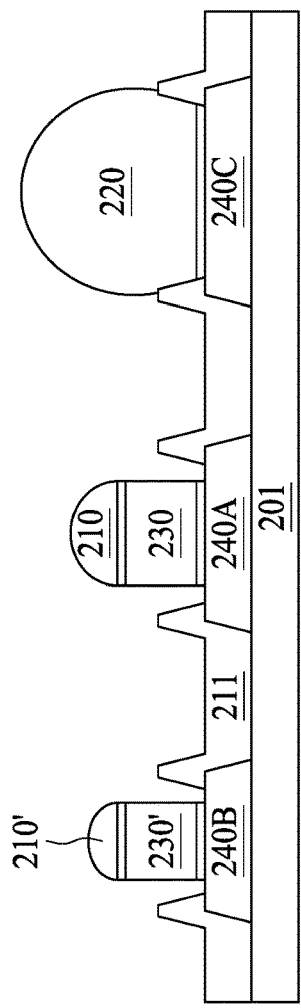
Figure 2H:
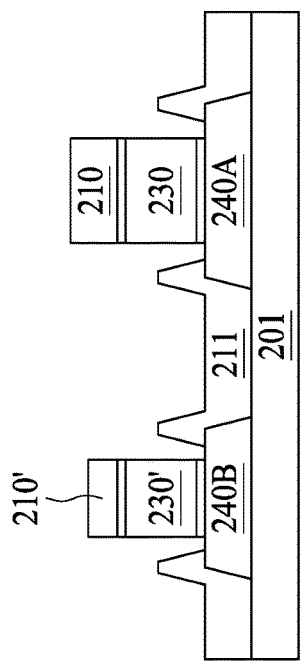

In FIG. 2F and FIG. 2G, the masking layer 215 is removed after the solder plating operation and the portion of the UBM not covered by the first and second conductive bumps 230, 230', is removed or etched, isolating the first conductive bump 230 and the second conductive bump 230'. In FIG. 2H, a first reflow operation is performed to transform solder bumps 210, 210' into molten state, and in FIG. 2I, a conductive terminal 220, or a solder ball, is planted or dropped over a third conductive pad 240C on the die area 201 of the semiconductor wafer, and a second reflow operation is conducted. Note in some embodiments, the first reflow and the second reflow operation can be merged at the stage when the solder ball is dropped. Subsequently, the semiconductor wafer is grounded and saw into a plurality of dies in accordance with the boundaries of each die areas. In FIG. 2J, the sawed die 201 is flipped chip bonded to a second die 202, such as a MEMS die, through the first conductive bump 230 and the first solder bump 210.

Referring to FIG. 3, FIG. 3 illustrates a cross sectional view of a semiconductor package 30, in accordance with some embodiments of present disclosure. The semiconductor package 30 includes a first die 301 bonded to a second die 302 through a first conductive bump 330. Specifically, the first conductive bump 330 is landed on a first conductive pad 340A of the first die 301. The first conductive pad 340A has a width greater than a width W1 of the first conductive bump 330. As previously discussed, the first die 301 can be an ASIC die, and the second die 302 can be a MEMS die. The first conductive bump 330 is joined to a conductive pad 350 of the second die 302 by a first solder bump 310. In some embodiments, a connection between the first die 301 and the second die 302 through the first conductive bump 330 and the first solder bump 310 rendering the first conductive bump 330 an active bump since the electronic signal from the second die 302 can be transmitted to the first die 301 through such connection and vice versa.

The semiconductor package 30 further includes a second conductive bump 330' landed on a second conductive pad 340B of the first die 301. The second conductive pad 340B has a width greater than a width W2 of the second conductive bump 330'. The second conductive bump 330' is free from joining to any conductive pad of the second die 302 because there is no solder bump at an end of the second conductive bump 330' facing the second die 302. Alternatively stated, the spacing HZ between the second conductive bump 330' and the second die 302 in a vertical direction is controlled so that the second conductive bump 330' does not touch the second die 302. In some embodiments, free of connection from the first die 301 to the second die 302 through the second conductive bump 330' rendering the second conductive bump 330' a dummy bump since no electronic signal from the second die 302 can be transmitted to the first die 301 through such connection and vice versa. In some embodiments, the second conductive bump 330' on the first surface 301A of the first die 301 serves as a mechanical stopper in the semiconductor package 30 when the second die 302 is a MEMS die, for example, a MEMS die integrated with pressure sensors.

Although the first conductive pad 340A and the second conductive pad 340B may have a substantially same width, the width W1 of the first conductive bump 330 is greater than the width W2 of the second conductive bump 330'. In some embodiments, the width W1 is less than about 2 times of the width W2. In some embodiments, the width W1 is about 1.3 to 1.5 times of the width W2. When two lithography operations are performed to form the first conductive bump 330 and the second conductive bump 330', a height H2 of the second conductive bump 330' may or may not be substantially identical to a height H1 of the first conductive bump 330.

A third conductive pad 340C on the first die 301 is connected to a conductive terminal 320, which in some embodiments can be a solder ball or printed solder paste. The conductive terminal 320 is configured to bond the first die 301 together with the second die 302 to a substrate 303. With the above description, the conductive terminal 320 may have a height greater than a summation of the heights H1, H1', and a thickness of the second die 302.

Referring to FIG. 3A to FIG. 3O, FIG. 3A to FIG. 3O illustrate cross sectional views of the semiconductor package during various manufacturing stages, in accordance with some embodiments of present disclosure. In FIG. 3A, a processed semiconductor wafer is received for subsequent packaging operations. The processed semiconductor wafer includes a plurality of die areas 301, each die area includes at least a first conductive pad 340A and a second conductive pad 340B. A polymeric layer 311, for example, polybenzoxazole (PBO) is formed on a surface of the die area 301 and covering an edge of the first and second conductive pads 340A, 340B. In FIG. 3B, an under bump metallization (UBM) 313 is conformably sputtered cover the first and second conductive pads 340A, 340B, and the polymeric layer 311. In FIG. 3C, a masking layer 315A, for example, a photoresist layer, is spun on and patterned over the semiconductor wafer, exposing a portion of the second conductive pad 340B through an opening 315'. Note a width of the opening 315' patterned at the current operation determines a width of the second conductive bump 330' formed in the subsequent operations. Current embodiment is not limited to expose the second conductive pad 340B prior to the first conductive pad 340A. It should be appreciated that under separate lithography operations, exposing any of the first conductive pad 340A and the second conductive pad 340B is within the contemplated scope of present disclosure.

In FIG. 3D, a metal plating operation is performed to form the second conductive bump 330' in the openings 315'. In some embodiments, the metal plating includes a copper electroplating operation. Optionally, a nickel (Ni) layer 316 is formed over the top of the second conductive bumps 330'. In FIG. 3E and FIG. 3F, the masking layer 315A is removed, concluding a first lithography operation. Another masking layer 315B is spun on and patterned over the semiconductor wafer, exposing a portion of the first conductive pad 340A through an opening 315". When the first conductive pad 340A and the second conductive pad 340B are having a same width, the opening 315" over the first conductive pad 340A can be wider than the opening 315' over the second conductive pad 340B by patterning design. When the first conductive pad 340A is wider than the second conductive pad 340B, the opening 315" over the first conductive pad 340A can be wider than the opening 315' over the second conductive pad 340B by simply scaling from the widths of underlying conductive pads 340A, 340B.

In FIG. 3G, a metal plating operation is performed to form the first conductive bump 330 in the openings 315". In some embodiments, the metal plating includes a copper electroplating operation. Optionally, a nickel (Ni) layer 316 is formed over the top of the first conductive bumps 330. In FIG. 3H, a solder plating operation is conducted to form solder bumps 310 over the first conductive bumps 330. In FIG. 3I, the masking layer 315B is removed, concluding a second lithography operation.

In FIG. 3J, FIG. 3K, and FIG. 3L, another masking layer 315C is spun on and patterned over the semiconductor wafer, exposing a portion of a third conductive pad 340C through an opening 315'''. A solder printing operation is conducted to form a conductive terminal 320 over the third conductive pad 340C. The masking layer 315C is then removed, concluding a third lithography operation.

In FIG. 3M and FIG. 3N, the semiconductor wafer is reflow to transform the first solder bump 310 and the conductive terminal 320 into molten state. The portion of the UBM not covered by the first, the second conductive bumps 330, 330', and the conductive terminal 320 is removed or etched, isolating the first conductive bump 330, the second conductive bump 330', and the conductive terminal 320. In FIG. 3O, the semiconductor wafer is grounded and saw into a plurality of dies in accordance with the boundaries of each die areas. In FIG. 3O, the sawed die 301 is flipped chip bonded to a second die 302, such as a MEMS die, through the first conductive bump 330 and the first solder bump 310.

Figure 4:
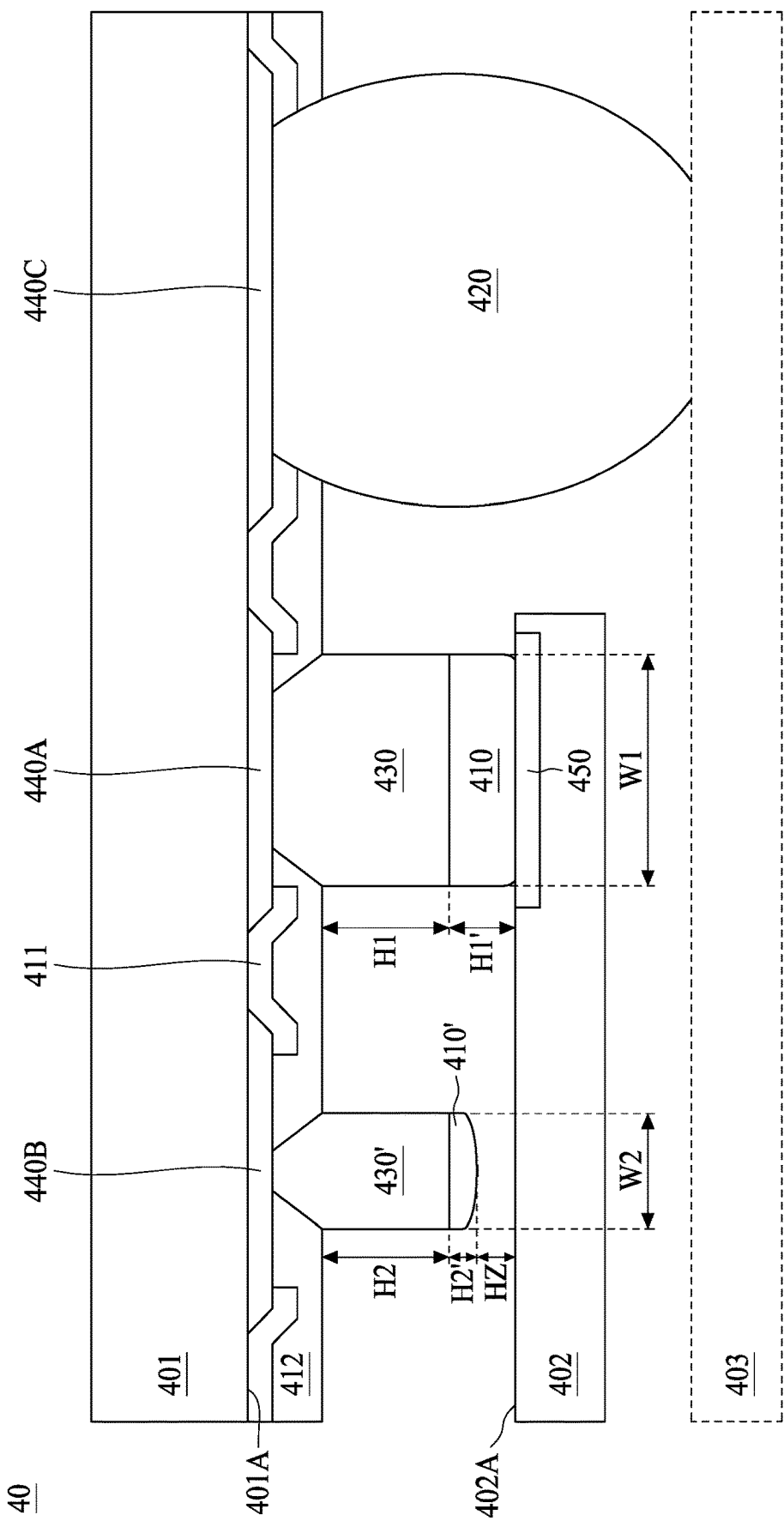
FIG. 4 illustrates a cross sectional view of a semiconductor package, according to some embodiments of the present disclosure.

Referring to FIG. 4, FIG. 4 illustrates a cross sectional view of a semiconductor package 40, in accordance with some embodiments of present disclosure. The semiconductor package 40 includes a first die 401 bonded to a second die 402 through a first conductive bump 430. Specifically, the first conductive bump 430 is landed on a first conductive pad 440A of the first die 401. The first conductive pad 440A has a width greater than a width W1 of the first conductive bump 430. As previously discussed, the first die 401 can be an ASIC die, and the second die 402 can be a MEMS die. The first conductive bump 430 is joined to a conductive pad 450 of the second die 402 by a first solder bump 410. In some embodiments, a connection between the first die 401 and the second die 402 through the first conductive bump 430 and the first solder bump 410 rendering the first conductive bump 430 an active bump since the electronic signal from the second die 402 can be transmitted to the first die 401 through such connection and vice versa.

The semiconductor package 40 further includes a second conductive bump 430' landed on a second conductive pad 440B of the first die 401. The second conductive pad 440B has a width greater than a width W2 of the second conductive bump 430'. Although having a solder bump 410' at one end of the second conductive bump 430', the second conductive bump 430' is free from joining to any conductive pad of the second die 402. Alternatively stated, the spacing HZ between the solder bump 410' and the second die 402 in a vertical direction is controlled so that the solder bump 410' does not touch the second die 402. In some embodiments, free of connection from the first die 401 to the second die 402 through the second conductive bump 430' rendering the second conductive bump 430' a dummy bump since no electronic signal from the second die 402 can be transmitted to the first die 401 through such connection and vice versa. In some embodiments, the second conductive bump 430' on the first surface 401A of the first die 401 serves as a mechanical stopper in the semiconductor package 40 when the second die 402 is a MEMS die, for example, a MEMS die integrated with pressure sensors.

The semiconductor package 40 further includes a first polymeric layer 411 covering an edge of the first conductive bump 440A and an edge of the second conductive bump 440B. In some embodiments, the first polymeric layer 411 can be composed of PBO. In some embodiments, the semiconductor package 40 further includes a second polymeric layer 412 in contact with the first polymeric layer 411 and a portion of the first conductive bump 440A and second conductive bump 440B. The second polymeric layer 412 can be composed of polyimide (PI) with a thickness of from about 3 μm to 8 μm.

Although the first conductive pad 440A and the second conductive pad 440B may have a substantially same width, the width W1 of the first conductive bump 430 is greater than the width W2 of the second conductive bump 430'. In some embodiments, the width W1 is less than about 2 times of the width W2. In some embodiments, the width W1 is about 1.3 to 1.5 times of the width W2. In some embodiments, the width W2 of the second conductive bump 430' can be altered to be substantially different from the width of the second conductive pad 440B by the formation of the second polymeric layer 412.

When the first conductive bump 430 and the second conductive bump 430' are formed under a same lithography operation, a height H1 of the first conductive bump 430 is substantially the same as a height H2 of the second conductive bump 430', as illustrated in FIG. 4. However, when two lithography operations are performed to form the first conductive bump 430 and the second conductive bump 430', the second conductive bump 430' may or may not have a same height as the first conductive bump 430.

A solder bump height H1' of the first solder bump 410 is substantially greater than a solder bump height H2' of the second solder bump 410', regardless of using one lithography operation or more than one lithography operations to perform the solder printing operation.

A third conductive pad 440C on the first die 401 is connected to a conductive terminal 420, which in some embodiments can be a solder ball or printed solder paste. The conductive terminal 420 is configured to bond the first die 401 together with the second die 402 to a substrate 403. With the above description, the conductive terminal 420 may have a height greater than a summation of the heights H1, H1', and a thickness of the second die 402.

Referring to FIG. 4A to FIG. 4M, FIG. 4A to FIG. 4M illustrate cross sectional views of the semiconductor package during various manufacturing stages, in accordance with some embodiments of present disclosure. In FIG. 4A, a processed semiconductor wafer is received for subsequent packaging operations. The processed semiconductor wafer includes a plurality of die areas 401, each die area includes at least a first conductive pad 440A and a second conductive pad 440B. A first polymeric layer 411, for example, polybenzoxazole (PBO) is formed on a surface of the die area 401 and covering an edge of the first and second conductive pads 440A, 440B. In FIG. 4B, a second polymeric layer 412 is patterned over the first polymeric layer 411 and exposing a predetermined portion of the conductive pads 440A, 440B through openings 412'. In FIG. 4C, an under bump metallization (UBM) 413 is conformably sputtered and covering the first and second conductive pads 440A, 440B, and the second polymeric layer 412. In FIG. 4D, a masking layer 415A, for example, a photoresist layer, is spun on and patterned over the semiconductor wafer, exposing a portion of the first and second conductive pads 440A, 440B through openings 415'. Note the UBM 413 covers the portion of the first and second conductive pads 440A, 440B exposed from the masking layer 415A. The UBM 413 lining a trench profile of the second polymeric layer 412 formed in the operation illustrated in FIG. 4B.

A width of the opening 415' patterned at the current operation determines a width of the first conductive bump 430 and a width the second conductive bump 430' formed in the subsequent operations. When the first conductive pad 440A and the second conductive pad 440B are having a same width, the opening 415' over the first conductive pad 440A can be wider than the opening 415' over the second conductive pad 440B by patterning design. When the first conductive pad 440A is wider than the second conductive pad 440B, the opening 415' over the first conductive pad 440A can be wider than the opening 415' over the second conductive pad 440B by simply scaling from the widths of underlying conductive pads 440A, 440B.

In FIG. 4E, a metal plating operation is performed to form the first conductive bump 430 and the second conductive bump 430' in the openings 415'. In some embodiments, the metal plating includes a copper electroplating operation. Under one electroplating operations, the first conductive bump 430' and the second conductive bump 430' possess a same height. Optionally, a nickel (Ni) layer 416 is formed over the top of the first and second conductive bumps 430, 430'. In FIG. 4F, a solder plating operation is conducted to form solder bumps 410, 410' over the first and second conductive bumps 430, 430', respectively. Note the solder bump 410' over the second conductive bump 430' is thinner than the solder bump 410 over the first conductive bump 430 since the thickness of solder plating depends on the underlying conductive area. The greater the area the thicker the solder bump would form. Based on this electroplating feature, a narrower conductive bump 430' can have a thinner solder bump 410', while a wider conductive bump 430 can have a thicker solder bump 410.

Figure 4H:
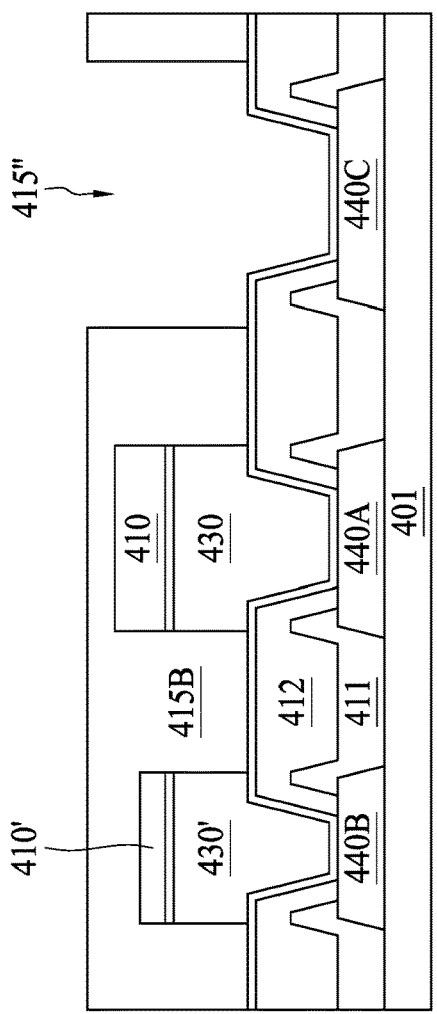
Figure 4I:
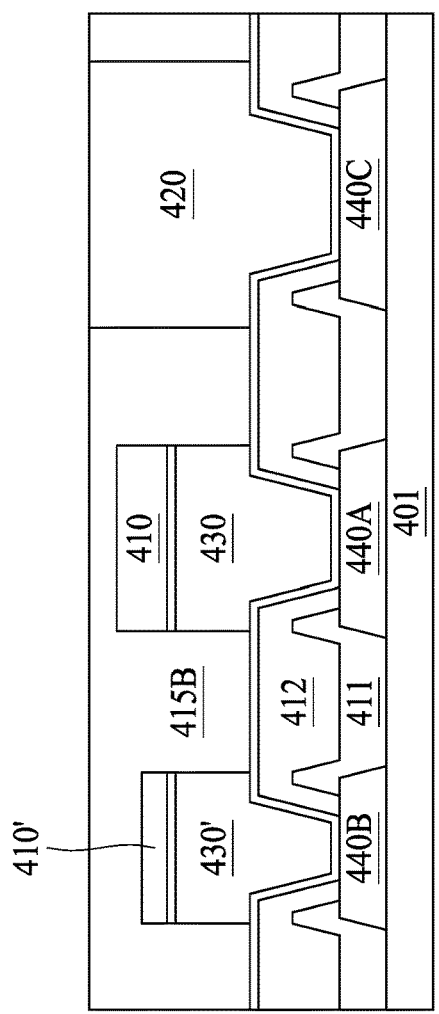
Figure 4F:
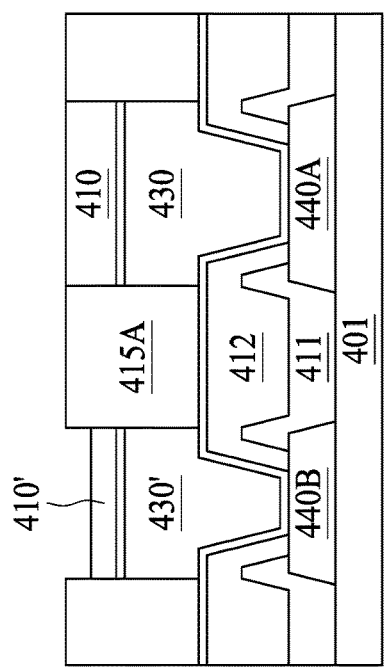
Figure 4G:
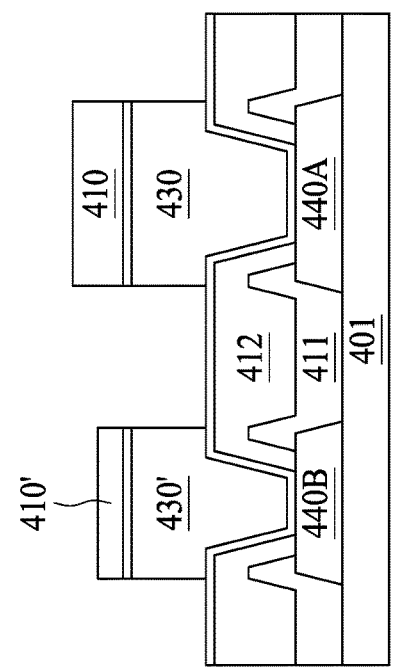
Figure 4L:
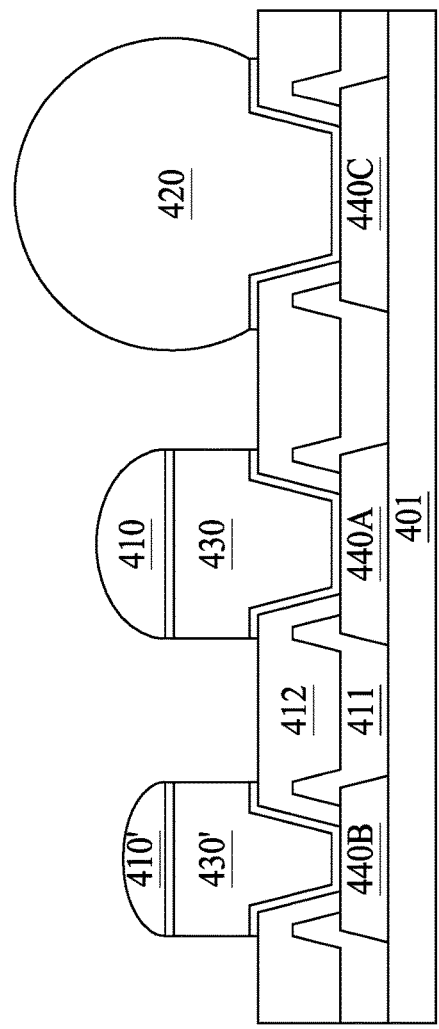
Figure 4M:
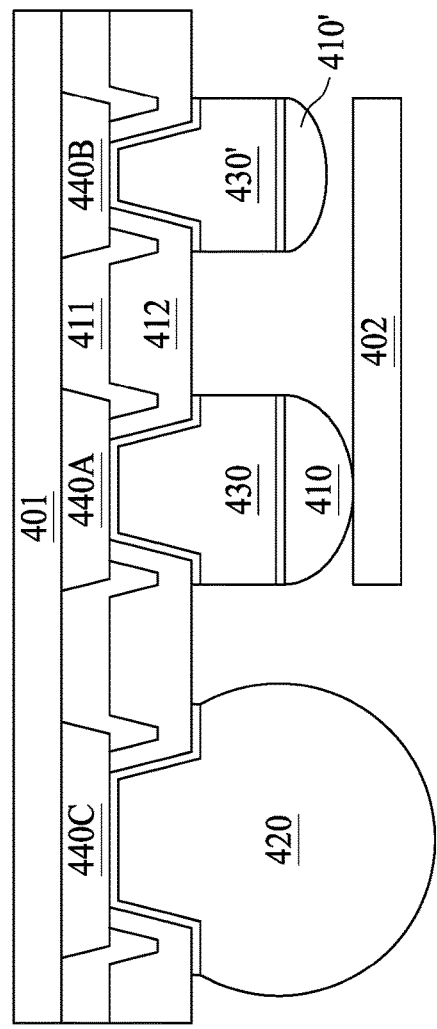

In FIG. 4G, FIG. 4H, and FIG. 4I, the masking layer 415A is removed after the solder plating operation, concluding the first lithography operation. A second masking layer 415B, for example, a photoresist layer, is then patterned over the semiconductor wafer and exposing a third conductive pad 440C of the first die 401 through an opening 415". A solder printing operation is taken place to fill the opening 415" with solder material in order to form a conductive terminal 420 in subsequent operations. In FIG. 4J, the second masking layer 415B is removed after the solder printing operation, concluding the second lithography operation. In FIG. 4K, FIG. 4L and FIG. 4M, the portion of the UBM not covered by the first, the second conductive bumps 430, 430', and the conductive terminal 420 is removed or etched, isolating the first conductive bump 430, the second conductive bump 430', and the conductive terminal 420. A reflow operation is performed to transform solder bumps 410, 410' and the conductive terminal 420 into molten state. Subsequently, the semiconductor wafer is grinded and saw into a plurality of dies in accordance with the boundaries of each die areas. The sawed die 401 is flipped chip bonded to a second die 402, such as a MEMS die, through the first conductive bump 430 and the first solder bump 410.

Figure 2I:
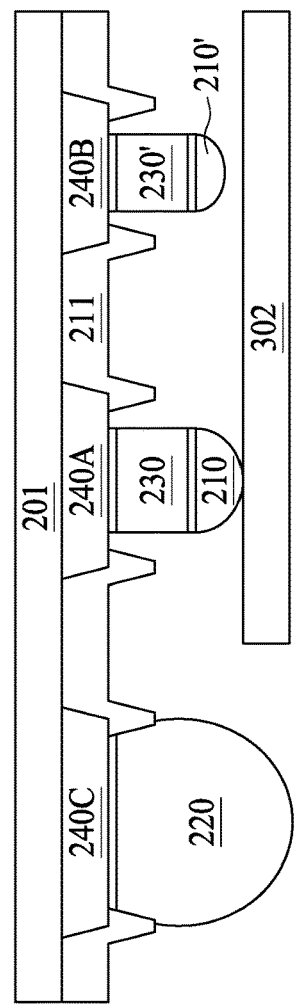
Figure 2J:
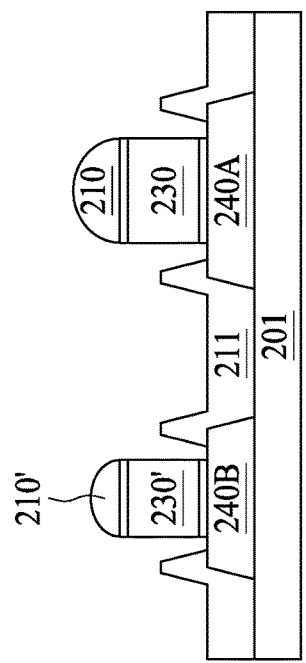

It should be appreciated that, formation of the conductive terminal 420 initiating in FIG. 4H can be replaced by a ball-dropping operation as previously described in FIG. 2I and is not repeated here for brevity.

Figure 5:
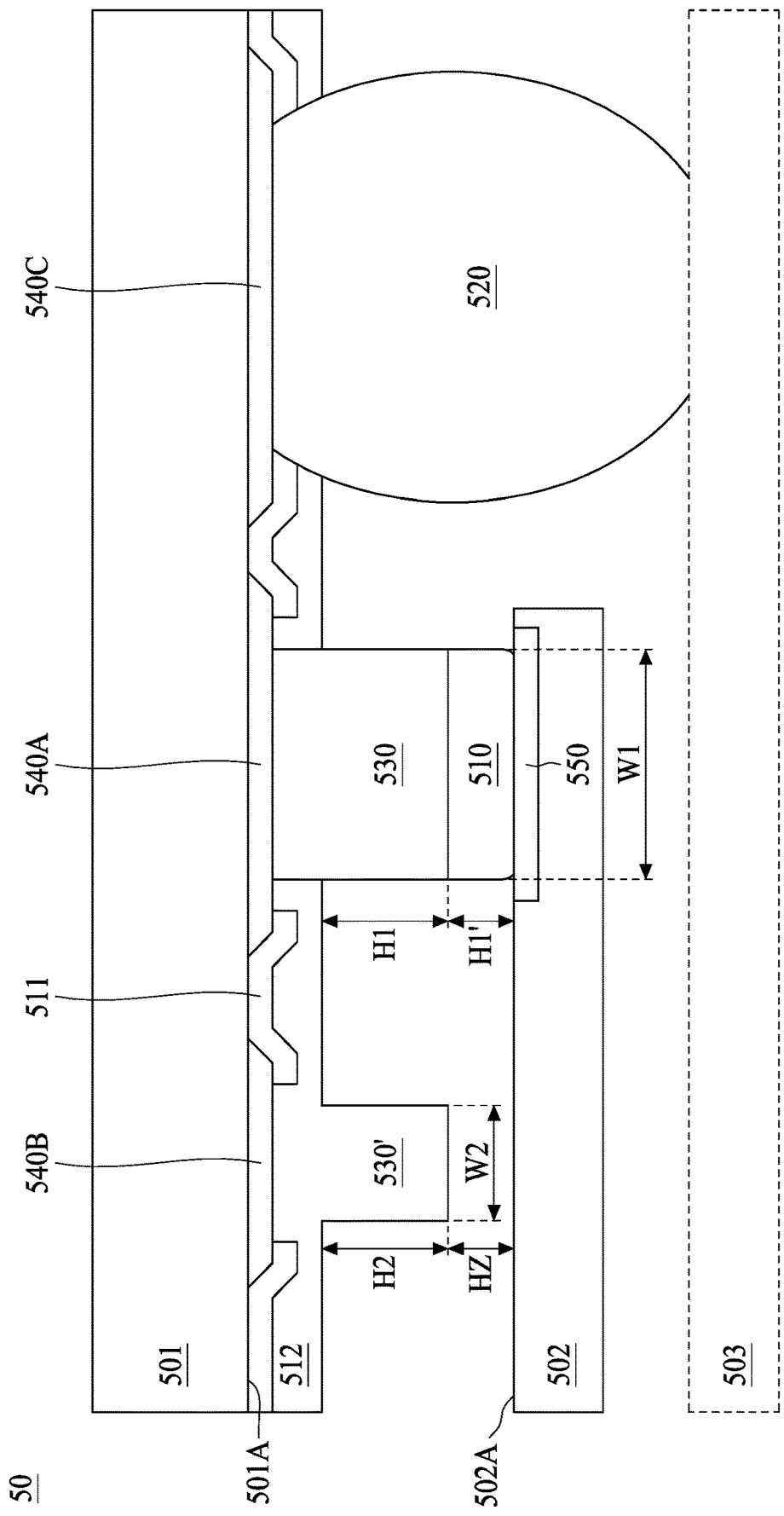
FIG. 5 illustrates a cross sectional view of a semiconductor package, according to some embodiments of the present disclosure.

Referring to FIG. 5, FIG. 5 illustrates a cross sectional view of a semiconductor package 50, in accordance with some embodiments of present disclosure. The semiconductor package 50 includes a first die 501 bonded to a second die 502 through a first conductive bump 530. Specifically, the first conductive bump 530 is landed on a first conductive pad 540A of the first die 501. The first conductive pad 540A has a width greater than a width W1 of the first conductive bump 530. As previously discussed, the first die 501 can be an ASIC die, and the second die 502 can be a MEMS die.

The first conductive bump 530 is joined to a conductive pad 550 of the second die 502 by a first solder bump 510. In some embodiments, a connection between the first die 501 and the second die 502 through the first conductive bump 530 and the first solder bump 510 rendering the first conductive bump 530 an active bump since the electronic signal from the second die 502 can be transmitted to the first die 501 through such connection and vice versa.

The semiconductor package 50 further includes a second conductive bump 530' landed on a second conductive pad 540B of the first die 501. The second conductive pad 540B has a width greater than a width W2 of the second conductive bump 530'. The second conductive bump 530' is free from joining to any conductive pad of the second die 502 because there is no solder bump at an end of the second conductive bump 530' facing the second die 502. Alternatively stated, the spacing HZ between the second conductive bump 530' and the second die 502 in a vertical direction is controlled so that the second conductive bump 530' does not touch the second die 502. In some embodiments, free of connection from the first die 501 to the second die 502 through the second conductive bump 530' rendering the second conductive bump 530' a dummy bump since no electronic signal from the second die 502 can be transmitted to the first die 501 through such connection and vice versa. In some embodiments, the second conductive bump 530' on the first surface 501A of the first die 501 serves as a mechanical stopper in the semiconductor package 50 when the second die 502 is a MEMS die, for example, a MEMS die integrated with pressure sensors.

Although the first conductive pad 540A and the second conductive pad 540B may have a substantially same width, the width W1 of the first conductive bump 530 is greater than the width W2 of the second conductive bump 530'. In some embodiments, the width W1 is less than about 2 times of the width W2. In some embodiments, the width W1 is about 1.3 to 1.5 times of the width W2. When two lithography operations are performed to form the first conductive bump 530 and the second conductive bump 530', a height H2 of the second conductive bump 530' may or may not be substantially identical to a height H1 of the first conductive bump 530.

A third conductive pad 540C on the first die 501 is connected to a conductive terminal 520, which in some embodiments can be a solder ball or printed solder paste. The conductive terminal 520 is configured to bond the first die 501 together with the second die 502 to a substrate 503. With the above description, the conductive terminal 520 may have a height greater than a summation of the heights H1, H1', and a thickness of the second die 502.

Figure 5G:
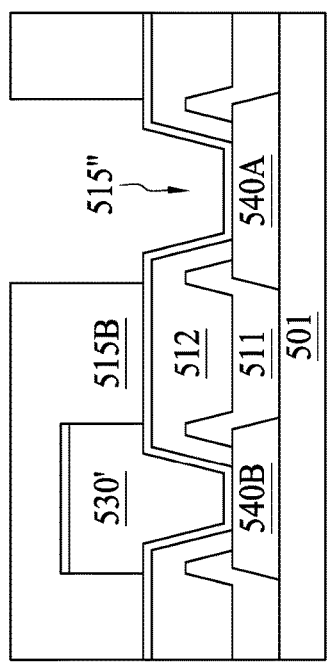
Figure 5H:
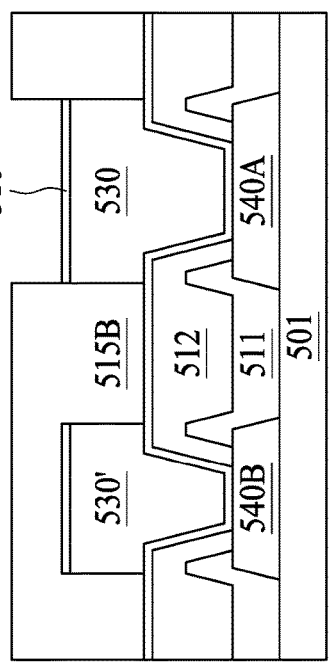
Figure 5I:
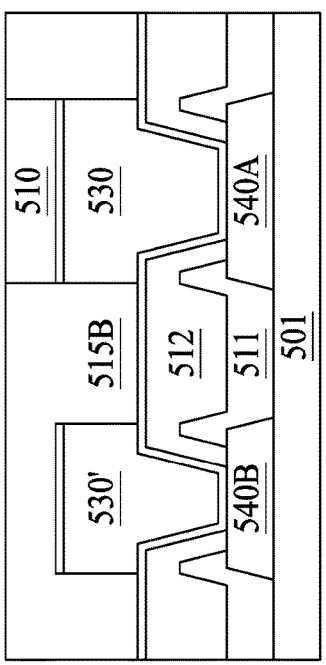
Figure 5J:
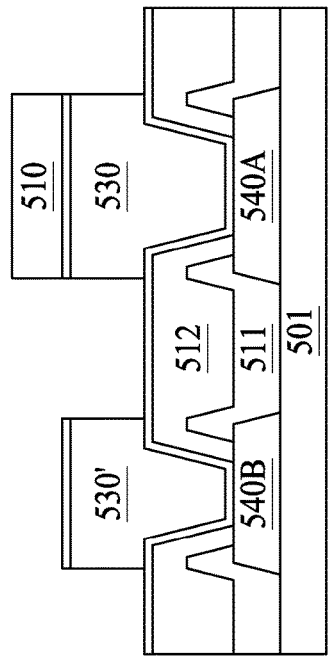
Figure 5K:
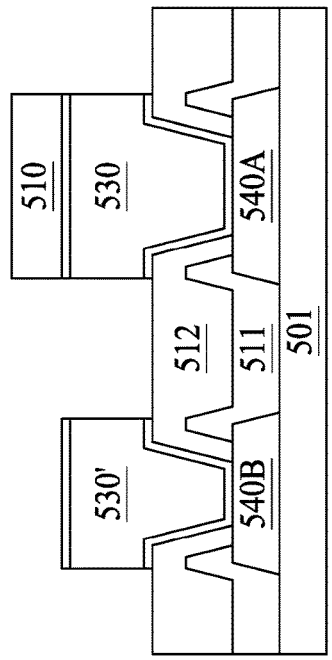
Figure 5L:
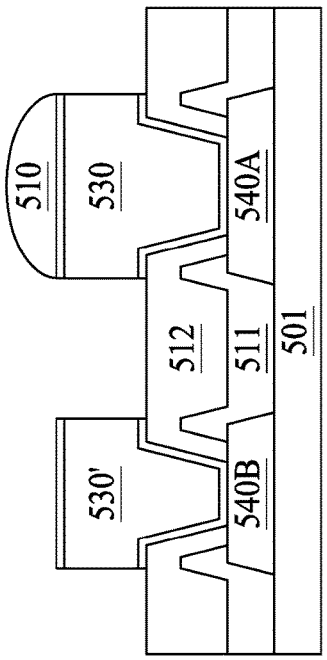
Figure 5M:
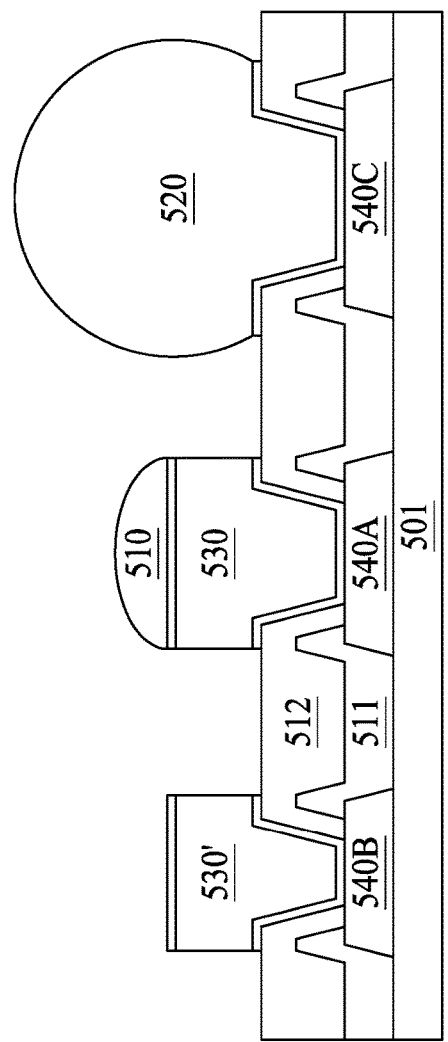
Figure 5N:
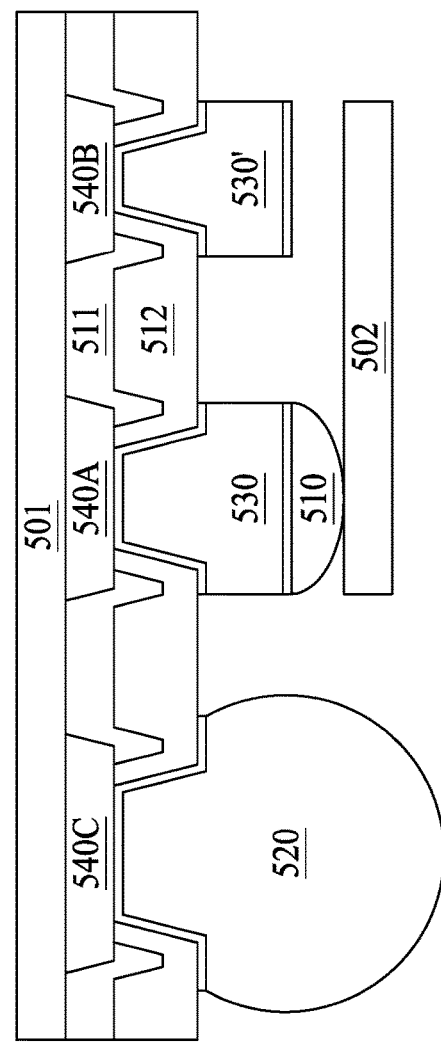

Referring to FIG. 5A to FIG. 5N, FIG. 5A to FIG. 5N illustrate cross sectional views of the semiconductor package during various manufacturing stages, in accordance with some embodiments of present disclosure. In FIG. 5A, a processed semiconductor wafer is received for subsequent packaging operations. The processed semiconductor wafer includes a plurality of die areas 501, each die area includes at least a first conductive pad 540A and a second conductive pad 540B. A first polymeric layer 511, for example, polybenzoxazole (PBO) is formed on a surface of the die area 501 and covering an edge of the first and second conductive pads 540A, 540B. In FIG. 5B, a second polymeric layer 512 is patterned over the first polymeric layer 511 and exposing a predetermined portion of the conductive pads 540A, 540B through openings 512'. In FIG. 5C, an under bump metallization (UBM) 513 is conformably sputtered and covering the first and second conductive pads 540A, 540B, and the second polymeric layer 512. In FIG. 5D, a masking layer 515A, for example, a photoresist layer, is spun on and patterned over the semiconductor wafer, exposing a portion of the second conductive pad 540B through an opening 515'. Note the UBM 513 covers the portion of the first and second conductive pads 540A, 540B exposed from the masking layer 515A. The UBM 513 lining a trench profile of the second polymeric layer 512 formed in the operation illustrated in FIG. 5B.

Note a width of the opening 515' patterned at the current operation determines a width of the second conductive bump 530' formed in the subsequent operations. Current embodiment is not limited to expose the second conductive pad 540B prior to the first conductive pad 540A. It should be appreciated that under separate lithography operations, exposing any of the first conductive pad 540A and the second conductive pad 540B is within the contemplated scope of present disclosure.

In FIG. 5E, a metal plating operation is performed to form the second conductive bump 530' in the openings 515'. In some embodiments, the metal plating includes a copper electroplating operation. Optionally, a nickel (Ni) layer 516 is formed over the top of the second conductive bumps 530'. In FIG. 5F and FIG. 5G, the masking layer 515A is removed, concluding a first lithography operation. Another masking layer 515B is spun on and patterned over the semiconductor wafer, exposing a portion of the first conductive pad 540A through an opening 515". When the first conductive pad 540A and the second conductive pad 540B are having a same width, the opening 515" over the first conductive pad 540A can be wider than the opening 515' over the second conductive pad 540B by patterning design. When the first conductive pad 540A is wider than the second conductive pad 540B, the opening 515" over the first conductive pad 540A can be wider than the opening 515' over the second conductive pad 540B by simply scaling from the widths of underlying conductive pads 540A, 540B.

In FIG. 5H, a metal plating operation is performed to form the first conductive bump 530 in the openings 515". In some embodiments, the metal plating includes a copper electroplating operation. Optionally, a nickel (Ni) layer 516 is formed over the top of the first conductive bumps 330. In FIG. 5I, a solder plating operation is conducted to form solder bumps 510 over the first conductive bump 530. In FIG. 5J, the masking layer 515B is removed, concluding a second lithography operation.

In FIG. 5K, FIG. 5L, and FIG. 5M, the portion of the UBM 513 not covered by the first, the second conductive bumps 530, 530' is removed or etched, isolating the first conductive bump 530 and the second conductive bump 530'. The semiconductor wafer undergoes a first reflow operation to transform the first solder bump 510 into molten state. A solder ball is then dropped on a third conductive pad 540C of the first die 510 to form a conductive terminal 520. A second reflow operation is then applied to transform the solder ball into molten state. It should be understood that the first and the second reflow operation and optionally merged into a single reflow operation after dropping the solder ball on the third conductive pad 540C.

In FIG. 5N, the semiconductor wafer is grounded and saw into a plurality of dies in accordance with the boundaries of each die areas. The sawed die 501 is flipped chip bonded to a second die 502, such as a MEMS die, through the first conductive bump 530 and the first solder bump 510.

It should be appreciated that, formation of the conductive terminal 520 initiating in FIG. 5M can be replaced by a solder printing operation with an additional lithography operation, as previously described in FIG. 4I and is not repeated here for brevity.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
    an electronic substrate;
    a micro electro mechanical system (MEMS) component adjacent to a first side of the electronic substrate and joined with the electronic substrate;
    a first conductive bump at the first side of the electronic substrate;
    a second conductive bump at the first side of the electronic substrate;
    a first solder bump on the first conductive bump, wherein the first solder bump is configured to bond the electronic substrate and the MEMS component;
    a second solder bump on the second conductive bump, wherein a height of the first solder bump is greater than a height of the second solder bump; and
    a third solder bump at the first side of the electronic substrate, wherein a bottom surface of the third solder bump and a bottom surface of the second solder bump are at different elevations.

2. The semiconductor package of claim 1, wherein the second solder bump is configured to prevent the second conductive bump from joining to the MEMS component.

3. The semiconductor package of claim 1, wherein the third solder bump has a height greater than a sum of a height of the first conductive bump, the height of the first solder bump, and a height of the MEMS component.

4. The semiconductor package of claim 1, wherein an elevation of a bottom surface of the first solder bump is between an elevation of the bottom surface of the second solder bump and an elevation of the bottom surface of the third solder bump.

5. The semiconductor package of claim 1, wherein an interface between the first conductive bump and the first solder bump is closer to the MEMS component than to the electronic substrate.

6. The semiconductor package of claim 1, wherein the third solder bump contacts a surface of the electronic substrate at a first elevation, and the first conductive bump contacts the surface of the electronic substrate at a second elevation substantially the same as the first elevation.

7. A semiconductor package, comprising:
    a first electronic component having a first surface;
    a second electronic component having a second surface facing the first surface;
    a first conductive bump over the first surface and configured to bond the first electronic component and the second electronic component;
    a second conductive bump over the second electronic component and spaced apart from the second electronic component, wherein the second conductive bump is configured to prevent the first electronic component from contacting the second electronic component, and the second conductive bump is spaced apart from the second electronic component by a space free of any connection element; and
    a nickel layer disposed on the second conductive bump and exposed to the space.

8. The semiconductor package of claim 7, further comprising a first solder bump connecting the first conductive bump to the second surface of the second electronic component, wherein a sum of a height of the first conductive bump and a height of the first solder bump is substantially equal to a sum of a height of the second conductive bump and a height of the space.

9. The semiconductor package of claim 7, wherein the second conductive bump is exposed to the space.

10. The semiconductor package of claim 7, wherein the first electronic component comprises a pad on which the second conductive bump is disposed, and the pad, the second conductive bump, and the space overlap in a vertical direction.

11. The semiconductor package of claim 7, further comprising a polymeric layer spaced apart from the second conductive bump.

12. A semiconductor package, comprising:
    an electronic substrate;

a micro electro mechanical system (MEMS) component adjacent to a first side of the electronic substrate and joined with the electronic substrate;

a first conductive bump at the first side of the electronic substrate;

a second conductive bump at the first side of the electronic substrate;

a first solder bump on the first conductive bump, wherein the first solder bump is configured to bond the electronic substrate and the MEMS component;

a second solder bump on the second conductive bump, wherein a height of the first solder bump is greater than a height of the second solder bump; and a third solder bump at the first side of the electronic substrate, wherein the third solder bump contacts a surface of the electronic substrate at a first elevation, and the first conductive bump contacts the surface of the electronic substrate at a second elevation substantially the same as the first elevation.

* * * * *